(12) United States Patent
Kume et al.

(10) Patent No.: US 10,073,126 B2
(45) Date of Patent: Sep. 11, 2018

(54) C-V CHARACTERISTIC MEASUREMENT SYSTEM AND METHOD FOR MEASURING C-V CHARACTERISTICS

(71) Applicant: SHIN-ETSU HANDOTAI CO., LTD., Tokyo (JP)

(72) Inventors: Fumitaka Kume, Gunma (JP); Hisatoshi Kashino, Gunma (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1057 days.

(21) Appl. No.: 14/380,076

(22) PCT Filed: Feb. 19, 2013

(86) PCT No.: PCT/JP2013/053915
§ 371 (c)(1),
(2) Date: Aug. 21, 2014

(87) PCT Pub. No.: WO2013/161356
PCT Pub. Date: Oct. 31, 2013

(65) Prior Publication Data
US 2015/0025826 A1  Jan. 22, 2015

(30) Foreign Application Priority Data
Apr. 23, 2012  (JP) ................................ 2012-097425

(51) Int. Cl.
*H01L 21/66* (2006.01)
*G01R 1/067* (2006.01)
(Continued)

(52) U.S. Cl.
CPC ......... *G01R 27/08* (2013.01); *G01R 1/06755* (2013.01); *G01R 31/2831* (2013.01); *H01L 22/14* (2013.01)

(58) Field of Classification Search
CPC . G01R 31/2648; H01L 21/3205; H01L 22/14; H01L 21/76254; H01L 31/0304; H01L 31/1037
(Continued)

(56) References Cited

U.S. PATENT DOCUMENTS

| 7,253,649 | B1 | 8/2007 | Chen | |
|---|---|---|---|---|
| 2002/0170815 | A1* | 11/2002 | Fujii | ................... B01D 53/007 204/157.3 |

(Continued)

FOREIGN PATENT DOCUMENTS

| JP | 06-140478 | 5/1994 |
|---|---|---|
| JP | 10-154733 | 6/1998 |

(Continued)

OTHER PUBLICATIONS

Taiwanese Office Action dated Aug. 10, 2015 for corresponding Taiwanese Application No. 10421060390.

(Continued)

*Primary Examiner* — Regis Betsch
*Assistant Examiner* — Kaleria Knox
(74) *Attorney, Agent, or Firm* — Michael Best & Friedrich LLP

(57) ABSTRACT

Proposed are a C-V characteristic measurement system and a method of measuring C-V characteristics that allow for less change in resistivity with time in repeated measurement of a single crystal silicon wafer using a mercury electrode, as compared to those in the related arts. Measurement is conducted with use of a C-V characteristic measurement system including: a mercury probe 30 for putting mercury as an electrode to contact with a single crystal silicon wafer; an LCR meter 40 for forming a depletion layer by supplying a high-frequency wave to the single crystal silicon wafer via the mercury probe 30 to apply a reverse bias voltage to the (Continued)

single crystal silicon wafer while measuring a capacitance of the depletion layer; analysis software for calculating C-V characteristics based on the reverse bias voltage and the capacitance of the depletion layer; and a static electricity removing device 20 for removing static electricity of the single crystal silicon wafer.

6 Claims, 5 Drawing Sheets

(51) Int. Cl.
   *G01R 31/28* (2006.01)
   *G01R 27/08* (2006.01)
(58) Field of Classification Search
   USPC ....... 324/750.26; 438/459; 257/E21.531, 76, 257/292; 702/65
   See application file for complete search history.

(56) References Cited

U.S. PATENT DOCUMENTS

| | | | | |
|---|---|---|---|---|
| 2007/0105344 A1* | 5/2007 | Uchida | ............. | H01L 21/32105 438/459 |
| 2007/0152699 A1 | 7/2007 | Jang | | |
| 2008/0296642 A1* | 12/2008 | Miura | ................. | H01L 31/1037 257/292 |
| 2010/0233449 A1* | 9/2010 | Terai | ..................... | G03F 7/2041 428/195.1 |
| 2013/0012033 A1* | 1/2013 | Kabe | ................ | H01J 37/32192 438/771 |
| 2013/0102126 A1* | 4/2013 | Aga | .................. | H01L 21/76254 438/458 |

FOREIGN PATENT DOCUMENTS

| | | | | |
|---|---|---|---|---|
| JP | 2001-144154 A | | 6/1998 | |
| JP | 10154733 | * | 6/1998 | ............. H01L 21/66 |
| JP | 11-150167 | | 6/1999 | |
| JP | 2002-516486 A | | 6/2002 | |
| JP | 2007-158314 A | | 6/2007 | |
| WO | WO99/60615 | * | 11/1999 | ............. G01R 27/26 |
| WO | WO-99/60615 A2 | | 11/1999 | |

OTHER PUBLICATIONS

International Search Report form PCT/ISA/210 dated May 8, 2013, PCT/IB/301 dated Mar. 12, 2013 and PCT/IB/304 dated Apr. 24, 2013.

Annual Book of ASTM Standards, Section 10 Electrical Insulation and Electronics vol. 10.05 Electronics (II), ASTM International, (2003).

Extended European Search Report dated Oct. 15, 2015 for European Application No. 13 781 025.5.

\* cited by examiner

C-V CHARACTERISTIC MEASUREMENT SYSTEM AND METHOD FOR MEASURING C-V CHARACTERISTICS

TECHNICAL FIELD

The present invention relates to a C-V characteristic measurement system and a method of measuring C-V characteristics, and more particularly, to a system and a method of measuring C-V characteristics of a single crystal silicon wafer by using a mercury probe.

BACKGROUND ART

As a method of measuring resistivity of a single crystal silicon wafer, a method of measuring capacitance-voltage (C-V) characteristics thereof has hitherto been known. For measuring the C-V characteristics, a Schottky barrier junction is formed on a surface of a single crystal silicon wafer to be measured, and then a reverse bias voltage is applied thereto while the voltage is continuously varied to expand a depletion layer in the single crystal silicon wafer, to thereby vary capacitance of the depletion layer. For forming a Schottky barrier junction on a surface of a single crystal silicon wafer, for example, a mercury electrode is used.

Mercury probes for measuring the C-V characteristics of a single crystal silicon wafer using a mercury electrode have been known. For example, Patent Document 1 discloses a mercury probe for measuring electrical characteristics of a single crystal silicon wafer using a top contact mercury probe, enabling the measurement of the electrical characteristics of the single crystal silicon wafer without contamination and surface defects of the wafer. In the mercury probe, mercury serving as an electrode is put in contact with the single crystal silicon wafer from above.

Moreover, Patent Document 2 discloses a mercury probe having an upward facing mercury electrode disposed to interface with a main surface of a semiconductor single crystal silicon wafer held upside down.

In the case where the single crystal silicon wafer to be measured is n-type, the C-V characteristics can be measured by preliminarily oxidizing the surface of the single crystal silicon wafer to form a thin silicon oxide film thereon and then putting a mercury electrode into contact with the silicon oxide film.

As a method of forming a thin silicon oxide film on a surface of a single crystal silicon wafer, for example in Non Patent Document 1, there is disclosed a method involving immersing a wafer in a solution containing an oxidant such as hydrogen peroxide for a few minutes, followed by rinsing and drying. Further, in Patent Document 3, there is disclosed a method of oxidizing a surface of a single crystal silicon wafer with ozone gas, involving exposing the single crystal silicon wafer to ultraviolet rays in an atmosphere containing oxygen.

PRIOR ART DOCUMENTS

Patent Document

Patent Document 1: JP Hei 6-140478 A
Patent Document 2: U.S. Pat. No. 7,253,649 B1
Patent Document 3: JP 2002-516486 A

Non Patent Document

Non Patent Document 1: ASTM Standards F1392-02

SUMMARY OF THE INVENTION

Problems to be Solved by the Invention

However, when the C-V characteristics of a single crystal silicon wafer are repeatedly measured with a mercury electrode after oxidation of the single crystal silicon wafer, the resistivity calculated based on the C-V characteristics tends to change with time and gradually decrease. In particular, this tendency is remarkable in the case where a surface of an n-type single crystal silicon wafer having a low resistivity of 0.2 Ωcm or less is oxidized with ozone gas.

The present invention has been made with a view to solving the problem described above, and proposes a C-V characteristic measurement system and a method of measuring C-V characteristics that allow for less change in the resistivity with time in repeated measurement of a single crystal silicon wafer using a mercury electrode, as compared to those in the related arts.

Means for Solving Problems

A C-V characteristic measurement system according to one embodiment of the present invention includes: a mercury probe for putting mercury as an electrode to contact with a single crystal silicon wafer; an LCR meter for forming a depletion layer by supplying a high-frequency wave to the single crystal silicon wafer via the mercury probe to apply a reverse bias voltage to the single crystal silicon wafer while measuring a capacitance of the depletion layer; analysis software for calculating C-V characteristics based on the reverse bias voltage and the capacitance of the depletion layer; and a static electricity removing device for removing static electricity of the single crystal silicon wafer.

It is desired that the C-V characteristic measurement system according to one embodiment of the present invention further include an ozone gas generating device for forming an oxide film on a surface of the single crystal silicon wafer.

A method of measuring C-V characteristics according to one embodiment of the present invention includes, after removing static electricity of a single crystal silicon wafer, forming a depletion layer by supplying a high-frequency wave to the single crystal silicon wafer via a mercury probe to apply a reverse bias voltage to the single crystal silicon wafer, and measuring C-V characteristics based on the reverse bias voltage and a capacitance of the depletion layer.

For example, the single crystal silicon wafer is n-type. It is particularly effective when the single crystal silicon wafer is of 0.2 Ωcm or less. Further, when the single crystal silicon wafer is n-type, it is desired that the removing static electricity be conducted after forming an oxide film on a surface of the single crystal silicon wafer by using ozone gas.

In the method of measuring C-V characteristics according to one embodiment of the present invention, it is preferred to place a light-blocking plate for blocking ultraviolet rays but allowing passage of ozone gas between an ultraviolet ray source and the n-type single crystal silicon wafer, and form an oxide film on a surface of the n-type single crystal silicon wafer while blocking the ultraviolet rays.

Advantageous Effects of the Invention

According to the C-V characteristic measurement system and the method of measuring C-V characteristics of the present invention, it is possible to suppress change in the resistivity with time in repeated measurement of a single crystal silicon wafer using a mercury electrode by preliminarily removing static electricity that is to affect the resistivity. Hence, it is possible to obtain stable measurement values for the C-V characteristics as compared to those in the related arts.

MODES FOR CARRYING OUT THE INVENTION

Figure 1:
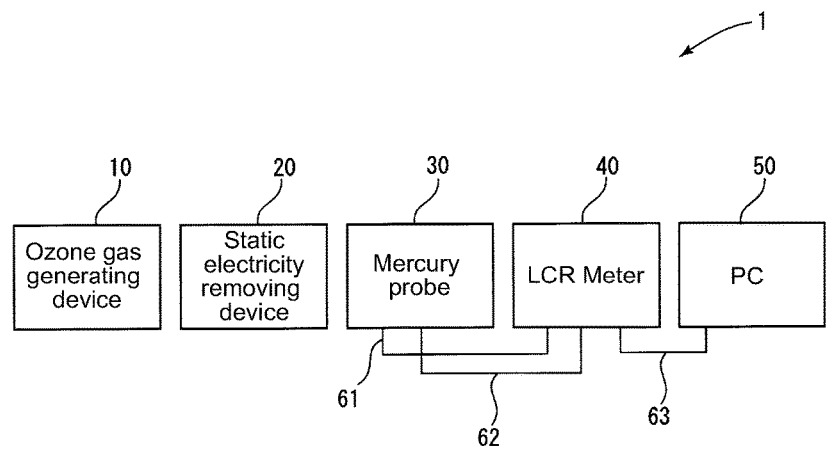
FIG. 1 is a schematic diagram illustrating an example of a C-V characteristic measurement system of the present invention.

The embodiments of the present invention are hereinafter described with reference to the attached drawings. FIG. 1 is a schematic diagram illustrating an example of a C-V characteristic measurement system of the present invention.

In FIG. 1, the reference numeral 1 represents a C-V characteristic measurement system. The C-V characteristic measurement system 1 includes an ozone gas generating device 10 for forming an oxide film on a surface of a single crystal silicon wafer by radiating ultraviolet rays in the air to generate ozone gas and atomic oxygen, a static electricity removing device 20 for removing static electricity of the single crystal silicon wafer by generating positive ions and negative ions from discharge needles, a mercury probe 30 for putting mercury as an electrode to contact with the single crystal silicon wafer, an LCR meter 40 for forming a depletion layer by supplying a high-frequency wave to the single crystal silicon wafer via measurement cables 61, 62 connected to the mercury probe 30 to apply a reverse bias voltage to the single crystal silicon wafer while measuring the capacitance of the depletion layer, and analysis software for calculating the C-V characteristics based on the reverse bias voltage and the capacitance of the depletion layer, the analysis software being installed in a personal computer (PC) 50 connected to the LCR meter 40 via a general purpose interface bus (GPIB) cable 63.

Figure 2:
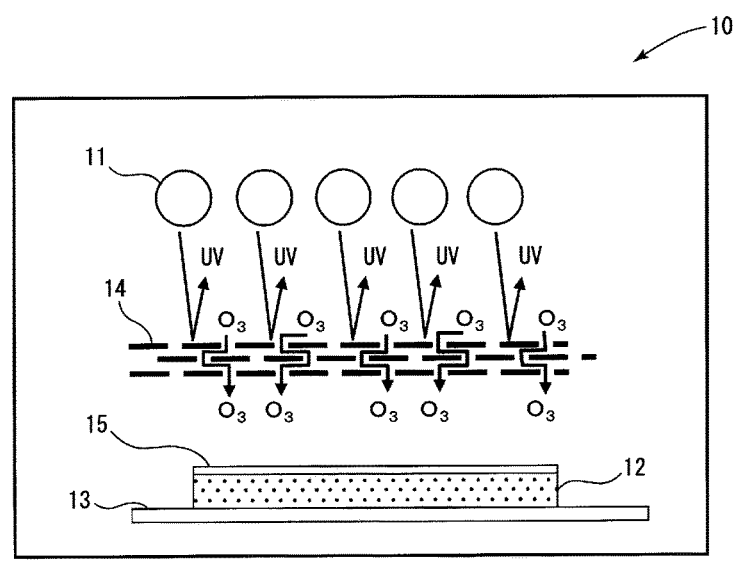
FIG. 2 is a schematic diagram illustrating an example of an ozone gas generating device to be used in the present invention.

For measurement of the C-V characteristics of the single crystal silicon wafer 12 of n-type, an oxide film 15 having a thickness of about 1 nm is first formed on a main surface of the single crystal silicon wafer (mirror polished wafer or epitaxial wafer) 12 by using the ozone gas generating device 10 illustrated in FIG. 2. The ozone gas generating device 10 includes a mercury lamp 11 serving as an ultraviolet ray source, a placing portion 13 for the single crystal silicon wafer 12, and a light-blocking plate 14 arranged between the mercury lamp 11 and the placing portion 13.

The ultraviolet rays radiated from the mercury lamp 11 include a wavelength of 184.95 nm. When the ultraviolet rays are radiated in the air, oxygen molecules decompose by a ray having a wavelength of 184.95 nm to generate ozone gas and atomic oxygen.

The light-blocking plate 14 includes a plurality of punching metal plates that are stacked one after another so that holes of adjacent punching metal plates are out of alignment. The ozone gas and atomic oxygen pass through the space between the punching metal plates and pass through holes to reach the single crystal silicon wafer 12, but most of the ultraviolet rays are blocked. As a result, the wafer 12 is not exposed directly to the ultraviolet rays and the surface of the wafer suffers less damage from the ultraviolet rays, and hence, less noise occurs in the C-V characteristics.

Figure 3:
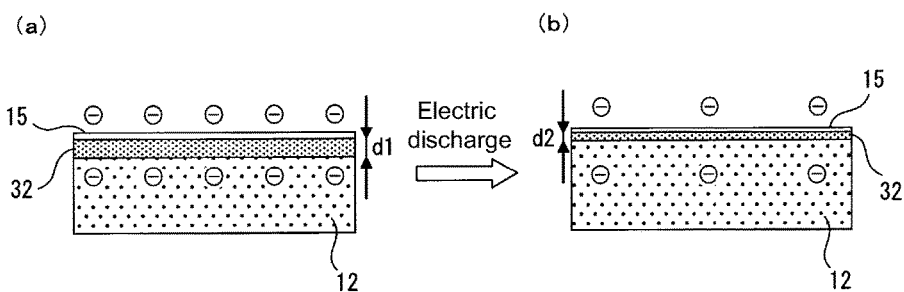
FIGS. 3(a) and 3(b) are schematic explanatory diagrams illustrating a state where static electricity is charged (a) and a state where static electricity is discharged (b) on a main surface of a single crystal silicon wafer.

When the oxide film 15 is formed on the main surface of the single crystal silicon wafer 12 by using the ozone gas generating device 10, the main surface of the single crystal silicon wafer 12 is charged with negative static electricity, as illustrated in FIG. 3(a). In the case where the single crystal silicon wafer 12 is n-type, the negative static electricity and n-type carriers repel each other to form a depletion layer 32 in the vicinity of the main surface.

Figure 4:
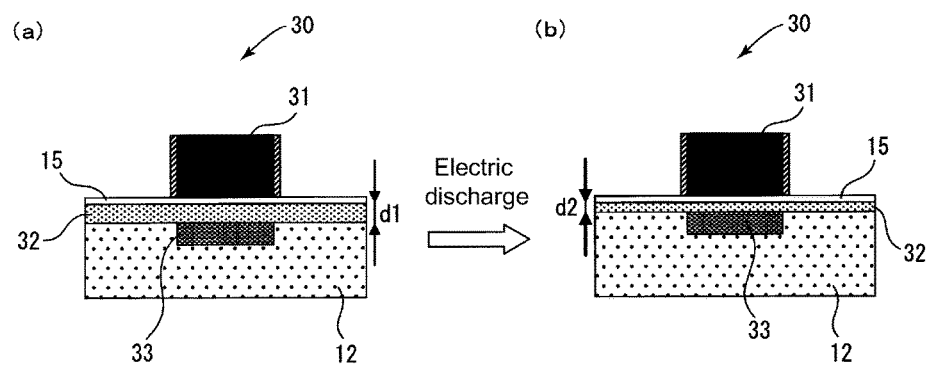
FIG. 4 are schematic explanatory diagrams illustrating an influence on a depletion layer during measurement of C-V characteristics of a single crystal silicon wafer, the depletion layer being formed by static electricity in a charged state (a) and by static electricity in a discharged state (b).

When the C-V characteristics are measured by putting a mercury electrode 31 to contact with the single crystal silicon wafer 12 in a state where the depletion layer 32 is formed and then applying a reverse bias voltage thereto to form a depletion layer 33, the depletion layer 33 formed by applying a reverse bias voltage and the depletion layer 32 formed by static electricity are in a serial relation, as illustrated in FIG. 4(a). When the static electricity is discharged with time and decreases, the width of the depletion layer 32 formed by static electricity gradually decreases from d1 to d2, as illustrated in FIG. 3(b) and FIG. 4(b). It should be noted that d1 and d2 represent widths of the depletion layer 32 formed by static electricity. d1 represents the width of the depletion layer 32 in a state where static electricity is charged and d2 represents the width of the depletion layer 32 in a state where static electricity is discharged.

Figure 5:
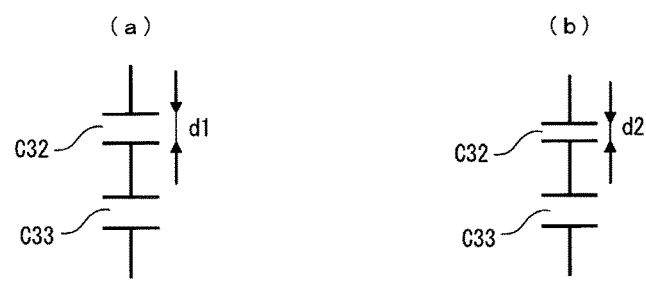
FIG. 5 are schematic explanatory diagrams illustrating a relation between the capacitance of a depletion layer formed by static electricity and the capacitance of a depletion layer formed by applying a reverse bias voltage, illustrating a state where static electricity is charged (a) and a state where static electricity is discharged (b).

Now, the capacitance C of the whole depletion layer is represented by the equation (1), where C32 represents the capacitance of the depletion layer 32 formed by static electricity and C33 represents the capacitance of the depletion layer 33 formed by applying a reverse bias voltage, because these capacitances are in a serial relation, as illustrated in FIGS. 5(a) and 5(b).

$$1/C = 1/C32 + 1/C33 \tag{1}$$

When the static electricity is discharged with time and the width of the depletion layer 32 decreases from d1 (FIG. 4(a)) to d2 (FIG. 4(b)), the capacitance C32 becomes larger based on a relation represented by the equation (2).

$$C32 = A\varepsilon_0 \varepsilon_{Si}/d \tag{2}$$

When the capacitance C32 becomes larger, the capacitance C of the whole depletion layer becomes larger based on the equation (1). In the equation (2), A represents an area of the electrode, $\varepsilon_0$ represents vacuum permittivity, and $\varepsilon_{Si}$ represents relative permittivity of Si.

In addition, there is a proportional relation as represented by the equation (3) between the capacitance C of the whole depletion layer and a impurity concentration at a depth W, N (W).

$$N(W) = C^3/(q\varepsilon_0 \varepsilon_{Si} A^2)/(dC/dV) \tag{3}$$

Hence, when the capacitance C of the whole depletion layer becomes larger, the impurity concentration N(W) becomes higher. In contrast, the resistivity that is inversely proportional to the impurity concentration N(W) becomes smaller. In the equation (3), q represents a charge amount of an electron.

Specifically, the resistivity determined by measuring the C-V characteristics of the n-type single crystal silicon wafer 12 by using the mercury probe 30 becomes larger due to the static electricity immediately after formation of the oxide film using ozone gas, but becomes gradually smaller because the static electricity is discharged with time. This phenomenon occurs in the n-type single crystal silicon wafer 12, in which negative static electricity and the n-type carriers repel each other. In a single crystal silicon wafer 12 containing p-type carriers, the resistivity does not decrease with time, because negative static electricity and the carriers do not repel each other and thus the depletion layer 32 is not formed.

Further, the capacitance of the depletion layer 32 formed by static electricity is considered to be in the order of nF. Therefore, in a region where the resistivity of the n-type single crystal silicon wafer 12 is high, the capacitance of the depletion layer 32 formed by static electricity is substantially negligible based on the equation (4) derived from the relation represented by the equation (1), because the capacitance of the depletion layer 33 formed during the measurement of the C-V characteristics is in the order of pF.

$$C = C33 \tag{4}$$

In contrast, in a region where the resistivity of the n-type single crystal silicon wafer 12 is low, specifically in a region where the resistivity is 0.2 Ωcm or less, the capacitance of the depletion layer 32 formed by static electricity is not negligible, because the capacitance of the depletion layer 33 formed during the measurement of the C-V characteristics is in or around the order of nF.

Figure 6:
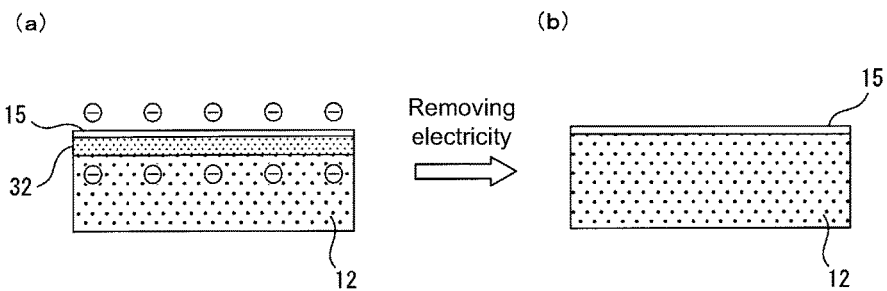
FIG. 6 are schematic explanatory diagrams illustrating an aspect of removing static electricity on a main surface of a single crystal silicon wafer, illustrating a state where static electricity is charged (a) and a state after static electricity is removed (b).

Thus, as illustrated in FIG. 6, after the oxide film 15 is formed on the main surface of the n-type single crystal silicon wafer 12 by using the ozone gas generating device 10, the static electricity is removed by using the static electricity removing device 20 in a state where the main surface of the single crystal silicon wafer 12 is charged with static electricity (FIG. 6(a)). As a result, the static electricity charged on the main surface of the single crystal silicon wafer 12 is removed and the depletion layer 32 concurrently disappears (FIG. 6(b)), which results in less decrease in the resistivity with time.

Figure 7:
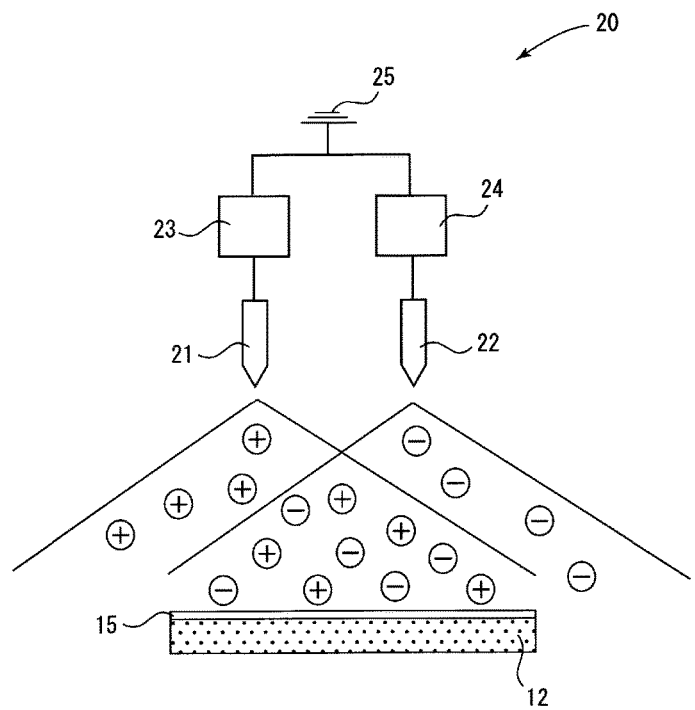
FIG. 7 is a schematic diagram illustrating an example of a static electricity removing device to be used in the present invention.

For example, as illustrated in FIG. 7, the static electricity removing device 20 includes an electrode needle 21 for generating + ions, an electrode needle 22 for generating − ions, electric sources 23, 24 for applying a direct voltage between the electrode needles 21, 22, and a grounding electrode 25. The static electricity removing device 20 generates corona discharge by applying a high voltage between the electrode needle 21 and the electrode needle 22.

When corona discharge is generated, air in the vicinity of the electrode needles 21, 22 is electrically decomposed to generate ions. By electrically neutralizing the static electricity having opposite polarities by these ions, the static electricity of the single crystal silicon wafer 12 is removed. In the measurement of the C-V characteristics of the n-type single crystal silicon wafer 12 after the removal of static electricity, the resistivity hardly changes with time.

Figure 8:
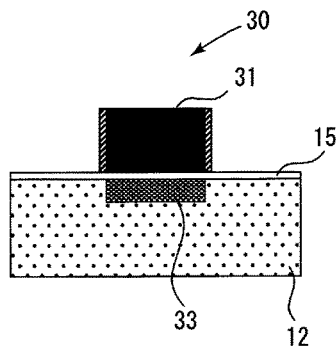
FIG. 8 is a schematic explanatory diagram illustrating a mercury probe.

As illustrated in FIG. 8, the mercury probe 30 to be used for the measurement of the C-V characteristics in the present invention forms the depletion layer 33 in the vicinity of the surface of the single crystal silicon wafer 12 through application of a reverse bias voltage to the mercury electrode 31 that is put in contact with the single crystal silicon wafer 12 as an electrode.

The application of a reverse bias voltage to the single crystal silicon wafer 12 and the measurement of the capacitance of the formed depletion layer 33 are conducted by the LCR meter 40 connected to the mercury probe 30 via the measurement cables 61, 62.

Moreover, the control of the LCR meter 40 and the calculation of the C-V characteristics based on the reverse bias voltage and the capacitance of the depletion layer are conducted by the analysis software installed in the personal computer (PC) 50 connected to the LCR meter 40 via the general purpose interface bus (GPIB) cable 63.

When the mercury electrode 31 is put in contact with the silicon oxide film 15 and a reverse bias voltage is applied to the n-type single crystal silicon wafer 12 while the voltage is continuously varied, the depletion layer 33 formed in the n-type single crystal silicon wafer 12 expands in accordance with the reverse bias voltage and the capacitance is measured by the LCR meter 40. The C-V characteristics are determined by plotting the relations between the reverse bias voltage and the capacitance on the graph.

Further, by assigning the reverse bias voltage and the capacitance to, for example, the equation (5) and the equation (6), the depth W of the n-type single crystal silicon wafer 12 and the dopant concentration N(W) at the depth W can be calculated. Hence, a profile of the dopant concentration in a depth direction of the single crystal can be obtained.

$$W = A\,\varepsilon_0 \varepsilon_{Si}/C \tag{5}$$

$$N(W) = 2/(q\varepsilon_0 \varepsilon_{Si} A^2) \times \{d(C^{-2})/dV\}^{-1} \tag{6}$$

When a measurement depth is specified in the profile of the dopant concentration in the depth direction of the single crystal, the dopant concentration at the specified depth is determined. Moreover, the determined dopant concentration can be converted into the resistivity through conversion of the dopant concentration using a conversion equation defined in ASTM STANDARDS F723 or the like.

By repeatedly measuring the dopant concentration or the resistivity thus obtained at the same portion of the n-type single crystal silicon wafer 12 a plurality of times, for example 10 times in succession, the magnitude of the change in the C-V characteristics with time can be evaluated as a variation coefficient. The variation coefficient is calculated by using the equation (7) based on, for example, an average value x and a standard deviation σ for the measurement values of 10 times. It should be noted that, in the repeated measurement, the mercury electrode 31 is moved away from the single crystal silicon wafer 12 and then put in contact therewith every measurement.

$$\text{Variation coefficient} = 1\sigma/x \times 100(\%) \tag{7}$$

It is possible to allow the variation coefficient to be 1% or less even in a region where the resistivity is 0.2 Ωcm or less by, after the static electricity removal step of removing static electricity of the n-type single crystal silicon wafer 12, forming a depletion layer by supplying a high-frequency wave to the n-type single crystal silicon wafer 12 via the mercury probe 30 to apply a reverse bias voltage to the n-type single crystal silicon wafer 12 while measuring the C-V characteristics based on the reverse bias voltage and the capacitance of the depletion layer and then calculating the resistivity, which allows for less decrease in the resistivity with time.

EXAMPLES

The present invention is hereinafter described in more detail with Examples, but it is needless to say that Examples are only illustrative and not intended to be interpreted in a limited way.

Example 1

(Change in Resistivity with Time)

An n-type epitaxial silicon wafer 12 having a diameter of 200 mm and a resistivity of 0.08 Ωcm is prepared, and an oxide film 15 having a thickness of about 1 nm is formed on its main surface by using the ozone gas generating device 10.

First, the n-type epitaxial silicon wafer 12 is placed on the placing portion 13 in the ozone gas generating device 10 and a light-blocking plate 14 produced by stacking three punching metal plates made of steel each having a hole diameter of 3 mm, a pitch of 5 mm, a staggered alignment of 60°, and a thickness of 1.5 mm so that the holes in the three punching metal plates are out of alignment is placed above the n-type epitaxial silicon wafer 12. The light-blocking plate 14 blocks 99% of light but mixed gas of ozone gas and atomic oxygen passes through the holes to reach the wafer 12.

Next, ultraviolet rays are radiated for 5 minutes by using a low-pressure mercury lamp 11 having a power of 28,000 μW/cm² at a wavelength of 254 nm (at a distance of 6 mm) and thus the oxide film 15 having a thickness of about 1 nm is formed on the main surface of the n-type epitaxial silicon wafer 12 with the mixed gas of ozone gas and atomic oxygen.

After purged with the ozone gas sufficiently, the n-type epitaxial silicon wafer 12 is taken out from the ozone gas generating device 10 and then the static electricity is removed for 5 minutes by using the static electricity removing device 20. As a result, the static electricity, which was −0.22 kV before the removal of static electricity, was improved to −0.03 kV.

Figure 9:
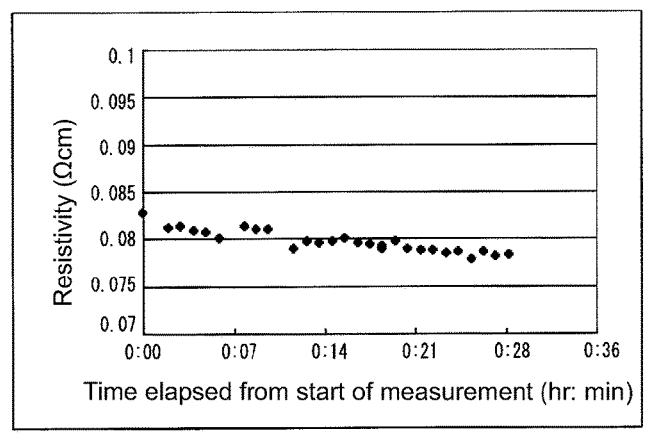
FIG. 9 is a graph showing results of repeated measurement of an n-type epitaxial silicon wafer after removal of static electricity in Example 1.

Subsequently, the mercury electrode 31 was put in contact with a center portion of the n-type epitaxial silicon wafer 12 after the removal of static electricity, and the resistivity was repeatedly measured for about 30 minutes in succession with the mercury probe 30. The results are shown in FIG. 9. As shown in FIG. 9, the resistivity decreased by 0.0044 Ωcm from 0.0827 Ωcm to 0.0783 Ωcm in about 30 minutes.

The variation coefficient was determined by using the equation (7) for the measurement values for the first 10 times in about 30 minutes. The results were that the average value was 0.081 Ωcm, the standard deviation was 0.000768 Ωcm, and the variation coefficient was 0.95%.

Example 2

(Variation Coefficient of Resistivity)

The oxide film 15 was formed on a mirror-polished n-type wafer 12 having a diameter of 200 mm and a resistivity of 0.18 Ωcm under the same conditions as in Example 1. After removing the static electricity, the mercury electrode 31 was put in contact with a center portion of the wafer 12 and the resistivity was repeatedly measured 10 times with the mercury probe 30. The variation coefficient was determined by using the equation (7). The results were that the average value was 0.184 Ωcm, the standard deviation was 0.0003 Ωcm, and the variation coefficient was 0.16%.

Comparative Example 1

(Change in Static Electricity with Time)

Figure 10:
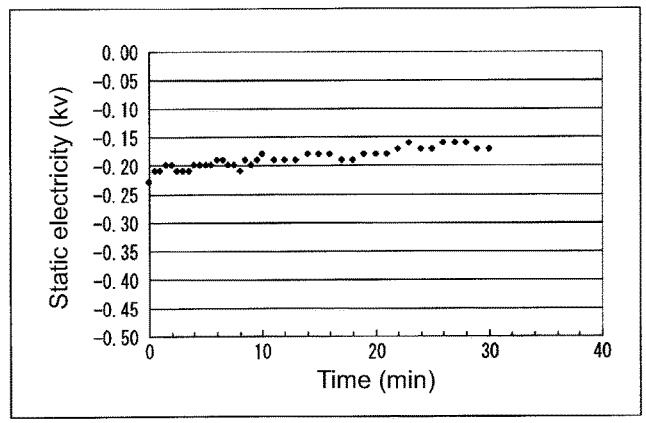
FIG. 10 is a graph showing change in static electricity with time after forming an oxide film by using an ozone gas generating device in Comparative Example 1.

After forming the oxide film 15 under the same conditions as in Example 1, change in static electricity with time on the main surface of the n-type epitaxial silicon wafer 12 was measured with a static electricity sensor. The results are shown in FIG. 10. As shown in FIG. 10, the static electricity decreased gradually from −0.23 kV to −0.16 kV in about 30 minutes.

(Change in Resistivity with Time)

Figure 11:
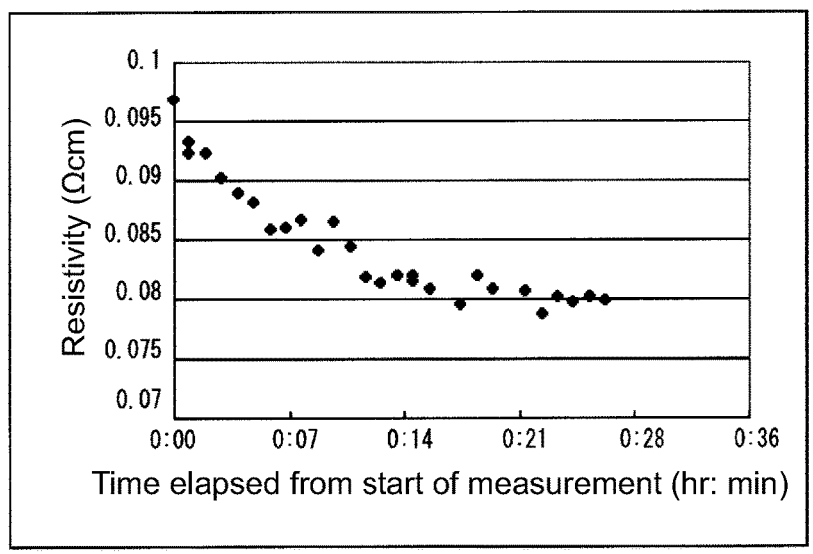
FIG. 11 is a graph showing results of repeated measurement of an n-type epitaxial silicon wafer without removing static electricity in Comparative Example 1.

After forming the oxide film 15 under the same conditions as in Example 1, the mercury electrode 31 was put in contact with a center portion of the n-type epitaxial silicon wafer 12 without removing static electricity and the resistivity was repeatedly measured with the mercury probe 30 for about 30 minutes in succession. The results are shown in FIG. 11. As shown in FIG. 11, the resistivity decreased by 0.0181 Ωcm from 0.0968 Ωcm to 0.0787 Ωcm in about 30 minutes.

(Variation Coefficient of Resistivity)

The variation coefficient was determined by using the equation (7) for the measurement values for the first 10 times in about 30 minutes. The results were that the average value was 0.09 Ωcm, the standard deviation was 0.0036 Ωcm, and the variation coefficient was 4.0%.

Comparative Example 2

The oxide film 15 was formed on a mirror-polished n-type wafer 12 having a diameter of 200 mm and a resistivity of 0.12 Ωcm under the same conditions as in Example 1. Without removing the static electricity, the mercury electrode 31 was put in contact with a center portion of the wafer 12 and the resistivity was repeatedly measured 10 times with the mercury probe 30. The variation coefficient was determined by using the equation (7). The results were that the average value was 0.125 Ωcm, the standard deviation was 0.0097 Ωcm, and the variation coefficient was 7.8%.

INDUSTRIAL APPLICABILITY

According to the C-V characteristic measurement system and the method of measuring C-V characteristics of the present invention, it is possible to suppress change in the resistivity with time in repeated measurement of a single crystal silicon wafer using a mercury electrode by preliminarily removing static electricity that is to affect the resistivity. Hence, it is possible to obtain stable measurement values for the C-V characteristics as compared to those in the related arts.

REFERENCE SIGNS LIST

10: ozone gas generating device, 11: mercury lamp, 12: single crystal silicon wafer, 13: placing portion, 14: light-blocking plate, 15: oxide film, 20: static electricity removing device, 21, 22: electrode needle, 23: electric source, 25: grounding electrode, 30: mercury probe, 31: mercury electrode, 32: depletion layer, 33: depletion layer, 40: LCR meter, 50: personal computer (PC), 61, 62: measurement cable, 63: GPIB cable

The invention claimed is:

1. A method of measuring C-V characteristics of an n-type single crystal silicon wafer, the method comprising:
    placing a light-blocking plate between an ultraviolet ray source and the n-type single crystal silicon wafer;
    forming an oxide film on a surface of the n-type single crystal silicon wafer by using ozone gas;
    removing static electricity from the n-type single crystal silicon wafer after forming the oxide film;
    supplying a high-frequency wave to the n-type single crystal silicon wafer via a mercury probe after removing the static electricity from the n-type single crystal silicon wafer; and
    measuring the C-V characteristics after supplying the high-frequency wave to the n-type single crystal silicon wafer,
    wherein when forming the oxide film, the light-blocking plate allows passage of the ozone gas onto the n-type single crystal silicon wafer while shielding ultraviolet rays from the n-type single crystal silicon wafer, and
    wherein supplying the high-frequency wave to the n-type single crystal silicon wafer applies a reverse bias voltage to the n-type single crystal silicon wafer and forms a depletion layer in the n-type single crystal silicon wafer, the reverse bias voltage and a capacitance of the depletion layer are used when measuring the C-V characteristics.

2. A method of measuring the C-V characteristics according to claim 1, wherein the n-type single crystal silicon wafer has a resistivity of 0.2 Ωcm or less.

3. A method of measuring C-V characteristics, according to claim 2 comprising, after removing static electricity of a single crystal silicon wafer, forming a depletion layer by supplying a high-frequency wave to the single crystal silicon wafer via a mercury probe to apply a reverse bias voltage to the single crystal silicon wafer, and measuring C-V characteristics based on the reverse bias voltage and a capacitance of the depletion layer,
    wherein the single crystal silicon wafer is n-type,
    wherein the single crystal silicon wafer has a resistivity of 0.2 Ωcm or less.

4. A method of measuring C-V characteristics according to claim 3, wherein the removing static electricity is conducted after forming an oxide film on a surface of the single crystal silicon wafer by using ozone gas.

5. A method of measuring C-V characteristics according to claim 3, further comprising:
    placing a light-blocking plate for blocking ultraviolet rays but allowing passage of ozone gas between an ultraviolet ray source and the n-type single crystal silicon wafer.

6. A method of measuring C-V characteristics according to claim 5, further comprising:
    forming an oxide film on a surface of the n-type single crystal silicon wafer while blocking the ultraviolet rays.

* * * * *